United States Patent
Zheng et al.

(10) Patent No.: US 7,437,401 B2
(45) Date of Patent: Oct. 14, 2008

(54) MULTIPLIER-ACCUMULATOR BLOCK MODE SPLITTING

(75) Inventors: Leon Zheng, San Jose, CA (US); Martin Langhammer, Alderbury (GB); Steven Perry, High Wycombe (GB); Paul Metzgen, Chiswick (GB); Gregory Starr, San Jose, CA (US); William Hwang, Fremont, CA (US); Kumara Tharmalingam, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 699 days.

(21) Appl. No.: 10/783,820

(22) Filed: Feb. 20, 2004

(65) Prior Publication Data

US 2005/0187998 A1    Aug. 25, 2005

(51) Int. Cl.
*G06F 7/48*     (2006.01)
(52) U.S. Cl. ...................................................... 708/523
(58) Field of Classification Search .................. 708/523
See application file for complete search history.

(56) References Cited

U.S. PATENT DOCUMENTS

| | | | |
|---|---|---|---|
| 6,298,366 B1 | 10/2001 | Gatherer et al. | |
| 6,446,195 B1 * | 9/2002 | Ganapathy et al. | 712/221 |
| 6,523,055 B1 | 2/2003 | Yu et al. | |
| 6,526,430 B1 | 2/2003 | Hung et al. | |
| 6,538,470 B1 | 3/2003 | Langhammer et al. | 326/41 |
| 6,606,700 B1 * | 8/2003 | Sih et al. | 712/35 |
| 7,010,558 B2 * | 3/2006 | Morris | 708/409 |
| 7,013,321 B2 * | 3/2006 | Saulsbury | 708/523 |
| 2002/0002573 A1 * | 1/2002 | Landers et al. | 708/501 |
| 2003/0141898 A1 | 7/2003 | Langhammer et al. | 326/40 |
| 2004/0220992 A1 * | 11/2004 | Peleg et al. | 708/523 |

OTHER PUBLICATIONS

Beuchat J, Tisserand A; "Small Multiplier-Based Multiplication and Division Operators for Virtex-II Devices" FLP 2002, LNCS 2438, 2002, pp. 513-552.

* cited by examiner

*Primary Examiner*—David H Malzahn
(74) *Attorney, Agent, or Firm*—Ropes & Gray LLP (57) ABSTRACT

A programmable logic device is provided that includes a MAC block having mode splitting capabilities. Different modes of operation may be implemented simultaneously whereby the multipliers and other DSP circuitry of the MAC block may be allocated among the different modes of operation. For example, one multiplier may be used to implement a multiply mode while another two multipliers may be used to implement a sum of two multipliers mode.

19 Claims, 8 Drawing Sheets

FIG. 1 n x n
MULTIPLIERS

MULTIPLIER-ACCUMULATOR BLOCK MODE SPLITTING

BACKGROUND OF THE INVENTION

The present invention relates to multiplier-accumulator ("MAC") blocks, and more particularly, the present invention relates to a more efficient way in which to make use of multipliers in a MAC block.

A MAC block, sometimes referred to as a digital signal processing ("DSP") block is DSP circuitry that implements a group of multipliers and other components such as arithmetic components. MAC blocks may be used in the processing of many different types of applications, including graphics applications, networking applications, communications applications, and video applications. Because of the versatility of MAC blocks, and of multipliers in general, manufacturers of programmable logic devices, such as Altera® Corporation of San Jose, Calif., have recently begun manufacturing programmable logic devices that, in addition to programmable logic circuitry, also contain hardware DSP circuitry in the form of MAC blocks. The MAC blocks of programmable logic devices provide a way in which certain functionality of a user's design may be implemented using less space on the programmable logic device and result in a faster execution time because of the nature of DSP circuitry relative to programmable logic circuitry.

MAC blocks are made of a number of multipliers and adders. Whenever one or more of the multipliers in a particular MAC block need to be used, the entire MAC block is placed into a mode of operation based on how many of the multipliers are to be used for the particular implementation. For example, if the MAC block contains a total of four 18 bit by 18 bit multipliers, and if a particular design requires the use of a single 18 bit by 18 bit multiplier, then the MAC block is put into a mode of operation such that each of the 18 bit by 18 bit multipliers can only be used individually in an 18 bit by 18 bit multiply mode. Therefore, the remaining three multipliers are limited for use only in 18 bit by 18 bit multiply modes. This results in an inefficient limitation on the potential use of the remaining multipliers in the MAC block.

It would therefore be desirable to implement a MAC block such that the multipliers in the MAC block may be used in different modes of operation simultaneously.

SUMMARY OF THE INVENTION

It is therefore an object of the present invention to provide a MAC block in which mode splitting among the multipliers in the MAC block may be enabled.

This and other objects of the present invention are accomplished by providing a programmable logic device having one or more MAC blocks in which different modes may be implemented simultaneously. The multipliers and other DSP circuitry (e.g., arithmetic circuitry such as adders) that make up a MAC block may be allocated among different modes of operation at any particular point in time. For example, in a preferred arrangement of a MAC block have four 18 bit by 18 bit multipliers, one 18 bit by 18 bit multiplier may be used to implement an 18 bit by 18 bit multiply mode, while two other multipliers may be used to implement the sum of two 18 bit by 18 bit multiplications mode. Any such suitable modes may be implemented simultaneously based on available resources.

Any suitable control signals and control circuitry may be used to control which modes are to be implemented in the MAC block. Control signals may, for example, indicate whether the output of a particular multiplier is to be input into an adder/subtracter based on whether the mode being implemented requires such circuitry. Because any suitable modes may be implemented in accordance with the present invention, it will be understood that any suitable control signals and control circuitry may be used. It will further be understood that different control signals and different control circuitry may be used to implement the same modes.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

The present invention provides a MAC block that allows its multipliers, other circuitry, or both to be split among one or more modes of operation simultaneously. One or more multipliers of the MAC block may be designated to operate in one mode (e.g., a multiply mode) whereas one or more other multipliers of the MAC block may be designated to operate in another mode (e.g., sum of multipliers mode). The present invention allows a single MAC block to support different modes that require different numbers of multipliers. For example, two multipliers may be used in one mode, whereas only one multiplier may be used in a second mode.

The present invention is particularly applicable to programmable logic devices that include integrated DSP circuitry. Because of the need for flexibility from such devices, allowing a MAC block to operate in more than one mode simultaneously allows for more efficient use of the DSP resources available within a particular programmable logic device.

Allowing a MAC block to operate in more than one different mode may be accomplished by using any suitable circuitry and any suitable control signals.

A MAC block according to the present invention may operate in any suitable modes. For example, in the case of a MAC block having four 18 bit by 18 bit multipliers, meaning that each can determine, as a 36-bit binary output, the product of two 18-bit binary multiplicand inputs, or the two products (concatenated into one 36-bit number) of two pairs of 9-bit binary multiplicand inputs (concatenated into one pair of 18-bit numbers), suitable modes include, but are not limited to, for example, an 18 bit by 18 bit multiplier, a 52 bit accumulator, an accumulator initialization, a sum of two 18 bit by 18 bit multipliers, a sum of four 18 bit by 18 bit multipliers, a 9 bit by 9 bit multiplier, a sum of two 9 bit by 9 bit multipliers, a sum of four 9 bit by 9 bit multipliers, a 36 bit by 36 bit multiplier, or any other suitable modes. The listed modes are sometimes referred to herein as modes 1-8, respectively, with the accumulator initialization being mode 2A. It will be understood that these are merely illustrative modes that may be supported by a MAC block in accordance with the present invention. Any other suitable modes may by supported. Such support of modes may be determined based on any suitable factors, including, for example, application needs, size of available multipliers, number of multipliers, or any other suitable factors. For example, it is clear that if a MAC block included eight 9 bit by 9 bit multipliers, different modes may be used (e.g., sum of eight 9 bit by 9 bit multipliers).

Different multipliers of a MAC block may be used in different modes simultaneously to avoid the situation where a particular mode makes use of relatively few multipliers of a MAC block, leaving the other multipliers idle.

In some embodiments of the present invention, a MAC block may be split into two or more sections of multipliers. Modes may be designated according to section, whereby all the multipliers in a section of multipliers are operating in the same mode. This arrangement may provide a more simple organization of control signals and provides a balance between flexibility and simplicity. Sections may be defined based on modes that are desired to be used. For example, if all multipliers of a MAC block are to be used in a particular mode, then splitting will not occur. If half the multipliers are needed for a particular mode, then the MAC block may be split such that there are two sections, each having half of the multipliers. Each of the two sections may then be operated under a different mode if desired. In one suitable approach, a section may be further split. For example, a MAC block may be split among three modes where one of the modes uses half of the multipliers, a second mode uses a quarter of the multipliers, and a third mode uses a quarter of the multipliers. A MAC block may be split among four modes where each mode uses one quarter of the available multipliers. Any such suitable mode splitting may be done in accordance with the present invention. If all the multipliers of a MAC block are required, then the MAC block will operate under a single mode.

For purpose of brevity and clarity, and not by way of limitation, and without loss of generality, the present invention is primarily described herein in terms of a MAC block made of four multipliers of 18 bit by 18 bit size. The illustrative nature of this arrangement will be appreciated and it will be understood that the teachings of the present invention may be applied to any other suitable type of MAC block having any suitable arrangement of component circuitries.

Figure 1:
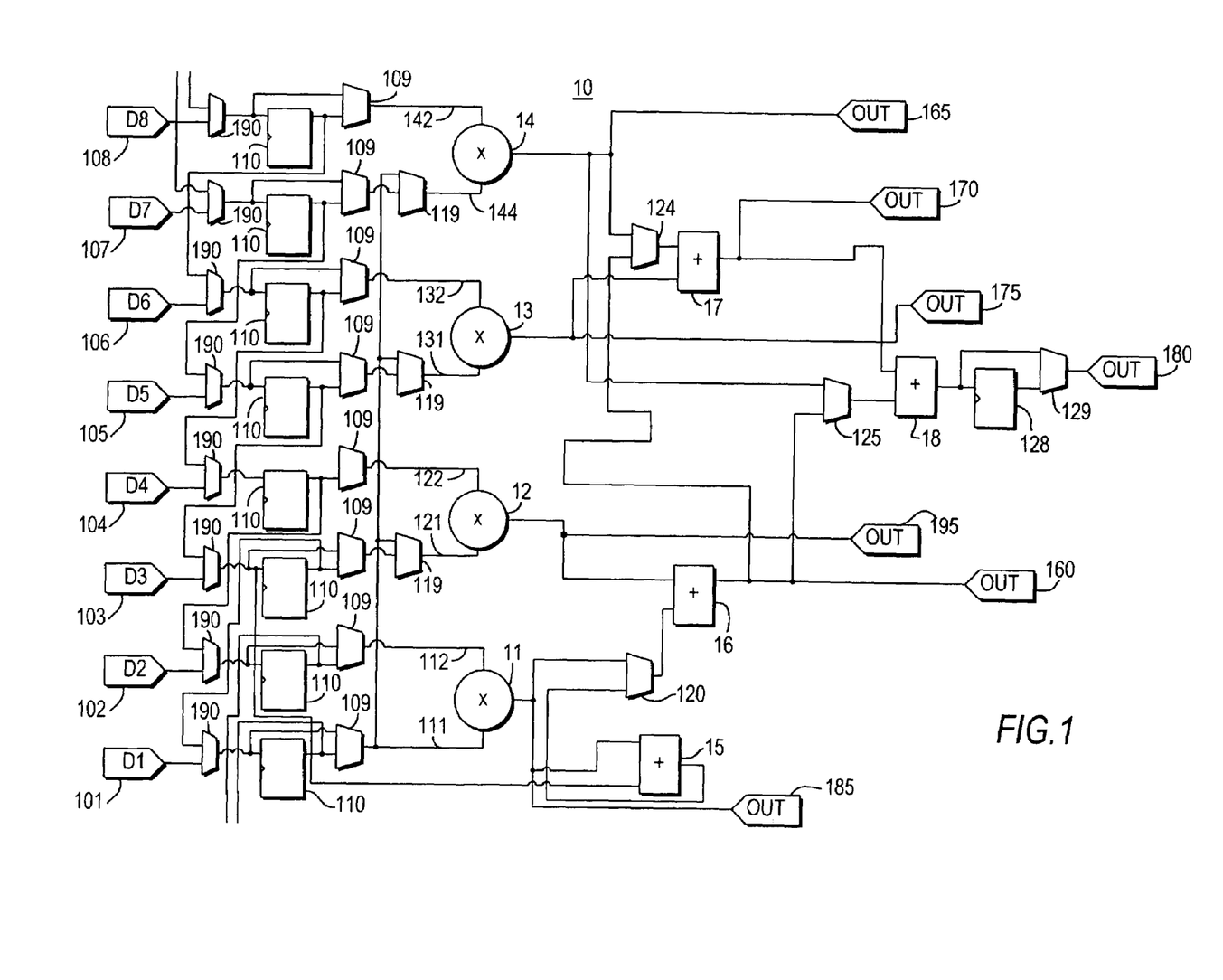
FIG. 1 is a schematic representation of an illustrative MAC block.

FIG. 1 shows the circuitry of an illustrative embodiment of a MAC block 10 of the type described above. MAC block 10, having inputs 101-108, includes four multipliers 11, 12, 13 and 14. Each of multipliers 11-14 may be an 18 bit by 18 bit multiplier. Each MAC block 10 preferably also includes a number of adder/subtracters 15, 16, 17 and 18 allowing the performance of addition and subtraction of the outputs of the various multipliers 11-14, as well as an accumulator function.

Multiplexers 119 allow the various multipliers 11-14 to share one input 101. Similarly, multiplexers 109 and registers 110 allow each of multiplier inputs 111, 112, 121, 122, 131, 132, 141, 142 to be registered or unregistered. In addition, registers 110, when used with multiplexers 190, can form input shift register chains that allow data to be entered serially. Such input shift register chains can even extend to other different specialized multiplier. The various functions may be output at 160, 165, 170, 175, 180, 185, 195.

According to the invention, if a user design includes multiplication and other arithmetic circuit elements, those elements, which may be referred to as "MAC elements", preferably are automatically grouped into a MAC block such as MAC block 10. MAC elements grouped together may perform, within the MAC block, the specialized functions of multiplication, multiplication followed by addition, multiplication followed by subtraction, and multiplication followed by accumulation.

Figure 2:
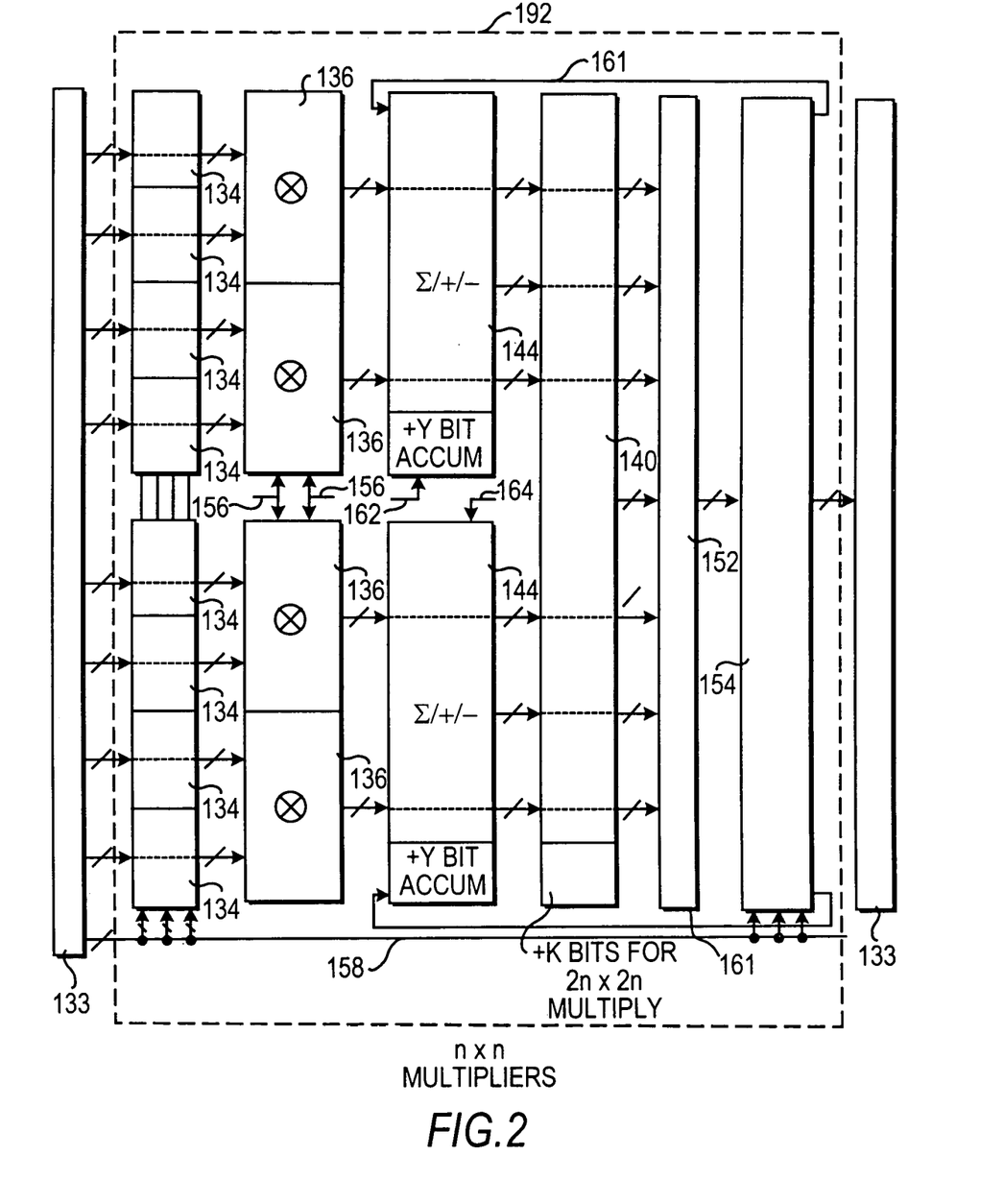
FIG. 2 is a block diagram of an illustrative MAC block in which four n bit by n bit multipliers are implemented as four n bit by n bit multipliers.

In FIG. 2, a vertically-arranged four multiplier-based organization of a MAC block is shown. Four multiplier circuits 136 may be stacked vertically to potentially operate in parallel. Each multiplier circuit 136 may include an n bits by n bits multiplier (e.g., 18 bit by 18 bit multiplier) to provide an n bits by n bits multiplication product. The inputs of each multiplier circuit may be fed up to n bits of information for the multiplicand and for the multiplier for the multiplier operation. Each multiplier circuit 136 may have an output that may be 2n-bits wide. Each multiplier circuit 136 may feed an output downstream that is the result of a multiplication operation. Each n bits by n bits multiplier circuit 136 may support two's complement signed or unsigned multiplication. Dynamic signed/unsigned control inputs 156 may receive input signals that control the sign of the multipliers and the multiplicands for the multiplier operations of multiplier circuits 136.

MAC block 192 may include three sets of register circuits. MAC block 192 may include input register circuits 134, pipeline register circuits, and output register circuit 154. If desired, additional pipeline register circuits may be included inside multiplier circuits 136, inside add-subtract-accumulate circuits 144, and/or inside add-subtract circuits 140 to increase speed. Output register circuit 154 may include approximately the same number of registers that are in input register circuits 134. The number of registers that are included in output register circuit 154 may be sufficient to register the output of MAC block 192 (e.g., register the output of MAC block 192 for all of the modes that are supported by MAC block 192). The number of output registers may be less than, equal to, or greater than the number of the input registers depending on what implementation or architecture is being used for MAC block 192 or depending on the range of functionality that is being provided by MAC block 192.

For clarity and brevity, pipeline register circuits are not shown in FIG. 2 and are not shown in some of the other FIGS. described herein. As mentioned above, input register circuits 134, pipeline register circuit, or output register circuit 154 may be included in MAC block 192 if desired. Independent sets of clock and clear signals 158 may be provided for input register circuits 134, the pipeline register circuit, or output register circuit 154. Two sets of clock and clear signals 158 may be provided for the input register circuits 134 and the pipeline register circuits, and two sets may be provided for output register circuit 154. Input register circuits 134 may include scan chains and may include additional circuitry to be used with the scan chains to allow the scan chains to be used as logic in some digital signal processing functions such as in providing FIR filters. Input register circuits 134 may include 8n registers (e.g., 144 registers) for 8n data inputs and q registers (e.g., 4 registers) for signed/unsigned control of multiplier circuits 136 and for add-subtract control of add-subtract-accumulate circuits 144. Each register may have programmable inversion capability to provide logic inversion, when desired, or to invert unused bits of register inputs when an input for a multiplier has less than n bits.

Output register circuit 154 may have feedback paths 161 to add-subtract-accumulate circuits 144 for accumulation operations. Any one of the three sets of registers, input register circuit 134, the pipeline register circuit, and output register circuit 154 may be bypassed using programmable logic connectors ("PLCs") in those circuits that may be controlled by random access memory control. The pipeline register circuit may include approximately the same number of registers as input register circuits 134.

Interface circuitry 133 shown to the left of MAC block 192 may feed the inputs of MAC block 192, which may be the inputs of input register circuits 134. Input register circuits 134 may include eight input registers that each have n bit inputs and that feed the inputs of the four n bit by n bits multiplier circuits 136.

Add-subtract-accumulate circuits 144 may have connections for receiving inputs from multiplier circuits 136 and from return paths 161. If desired, add-subtract-accumulate circuits 144 may be configured to pass the outputs from multiplier circuits 136 to adder circuit 140. The outputs of multiplier circuits 136 may be routed to output selection circuit 152 or output register circuit 154 without being routed through add-subtract-accumulate circuits 144 and/or add-subtract circuit 140. For the purposes of clarity and brevity and not by way of limitation and without loss of generality, add-subtract circuit 140 is described herein primarily in the context of an adder circuit. Add-subtract-accumulate circuits 144 may each be configured to perform a two's complement addition of two 2n bit inputs to produce a 2n+1 bit output. Add-subtract-accumulate circuits 144 may each be configured to perform a two's complement subtraction of two 2n bit inputs to produce a 2n+1 bit output. Add-subtract-accumulate circuits 144 may each be configured to perform an accumulation of one 2n bit input with an n+y bit output. Dynamic add/subtract control inputs 162 and 164 may be inputs to add-subtract-circuits 144 that are used to switch between addition and subtraction operations and to handle complex multiplications. Dynamic add/subtract inputs 162 and 164 may be needed for complex multiplications, which involves multiplications involving complex numbers. Complex multiplication of two complex numbers may sometimes involve both an addition operation and a subtraction operation.

The outputs of add-subtract-accumulate circuits 144 may be routed to output selection circuit 152 or output register 154 without being routed through adder circuit 140. If desired, adder circuit 140 may be configured to pass inputs from add-subtract-accumulate circuits 144 (e.g., n+1 bit output of two's complement addition, n+y bit output of accumulation, etc.). Adder circuit 140 may have an output that is the resultant of the addition of the outputs from add-subtract-accumulate circuits 144. Output selection circuit 152 may have inputs that are from adder circuit 140. Output selection circuit 152 may select which ones of the inputs of output selection circuits 152 are passed to output register circuit 154. Output register circuit 154 may feed the inputs of interface circuitry 133 shown to the right of MAC block 192. The percent of local interconnect resources that is allocated for connecting the circuits in MAC block 192 increases as the complexity and the variations in digital signal processing functionality increases from left to right in MAC block 192.

With reference to FIG. 2, the "top half" of MAC block 192 may include, among other components, the two multipliers 136 and adder/subtracter 144 shown at the top of MAC block 192. The "bottom half" of MAC block 192 may include, among other components, the two multipliers 136 and adder/subtracter showing at the bottom of MAC block 192.

MAC block 192 may be configured to have an n/2 bits by n/2 bits multiplier based organization. For example, with reference now to FIG. 3, MAC block 192 may include multiplier circuits 136 that are configured to include eight n/2 bits by n/2 bits multipliers. The eight n/2 bits by n/2 bits multipliers may be configured from the four n bits by n bits multipliers of multiplier circuits 136 of FIG. 2.

Figure 3:
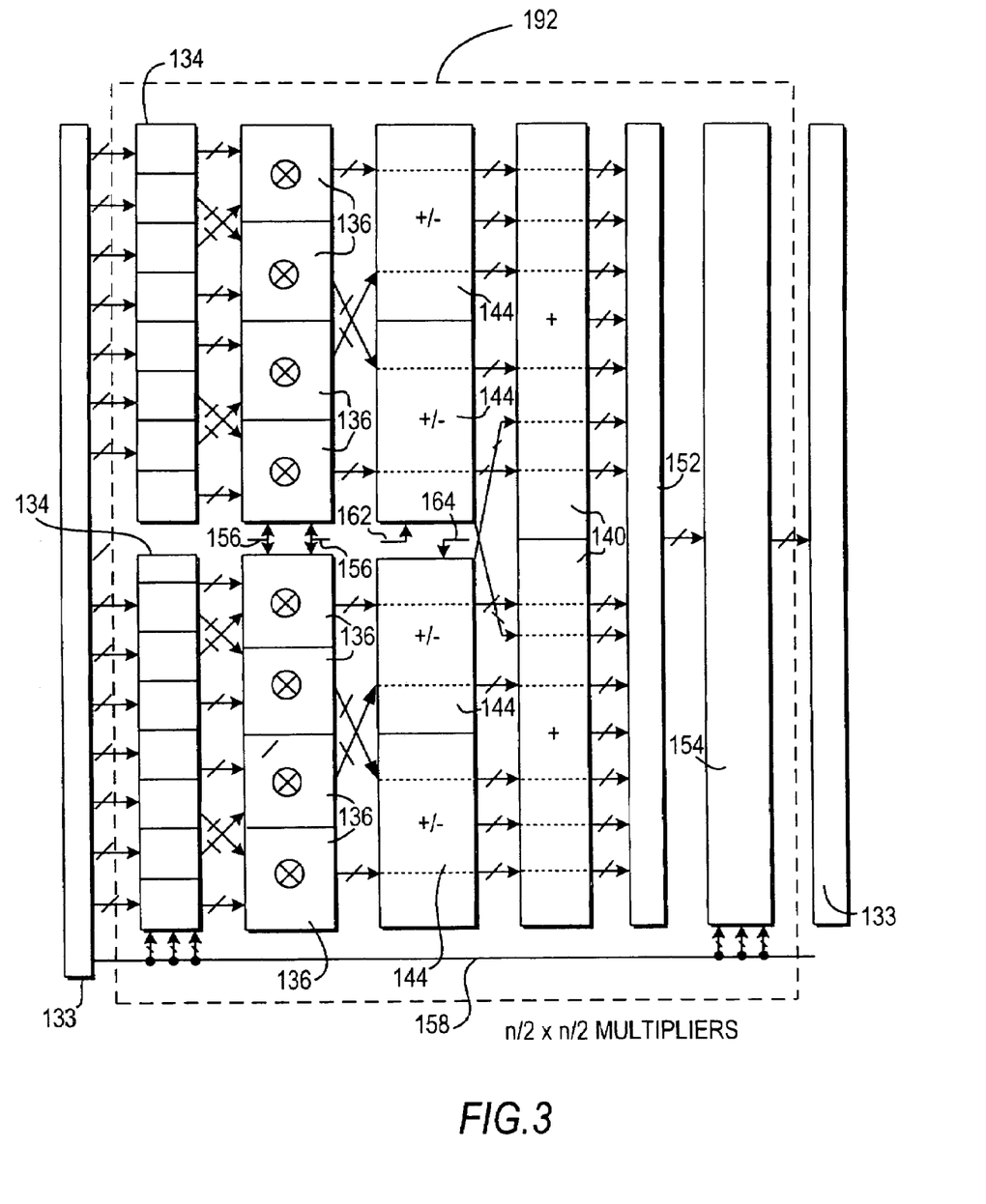
FIG. 3 is a block diagram of an illustrative MAC block in which four n bit by n bit multipliers are implemented as eight n/2 bit by n/2 bit multipliers.

If desired, MAC block 192 may be implemented to be able to be configured to have a p bits by p bits multiplier based organization and to have one or more p/m bits by p/m bits multiplier based organizations where p, m, and p/m are integers. As mentioned above, this architecture is at least partially based on the limitations of the local interconnect resources. The different organizations may be selectable and MAC block 192 may be capable of being configured into some or all of the p/m bits by p/m bits multiplier based organizations.

MAC block 192 may include add-subtract-accumulate circuits 144 configured to provide four add or subtract units. Each add or subtract unit may perform an addition-based operation on two n bit inputs and have an n+1 bit output. If desired, add-subtract-accumulate circuits 144 may be configured to pass the outputs of the n/2 bits by n/2 bits multiplier operation. The outputs of multiplier circuits 136 may be routed to output selection circuit 152 or output register circuit 154 without being routed through add-subtract-accumulate circuits 144 or adder circuit 140. Add-subtract-accumulate circuits 144 may produce the resultant of the addition (or subtraction) of particular output pairs of the n/2 bits by n/2 bits multiplier operation.

MAC block 192 may include adder circuit 140 configured to provide two adders. If desired, adder circuit 140 may pass the inputs that are fed to adder circuit 140 from add-subtract-accumulate circuits 144. The outputs of add-subtract-accumulate circuits 144 may be routed to output selection circuit 152 or output register circuits 154 without being routed through adder circuit 140. Adder circuit 140 may produce two outputs that are the resultants of the addition of particular pairs of outputs from add-subtract-accumulate circuits 144.

The local interconnect resources of MAC block 192 may be configurable to implement the n/2 bits by n/2 bits multiplier based organization with the same input/output interface circuitry 133 and supporting circuitry (e.g., multiplier circuits 136, adder circuit 140, etc.) as the n bits by n bits multiplier based organization. The local interconnect resources of MAC block 192 may be configured to include some butterfly cross connection patterns for forming appropriate interconnections in the n/2 bits by n/2 bits multiplier based organization.

The butterfly cross connection patterns are implemented for select interconnections between input register circuits 134 and multiplier circuits 136. The butterfly cross connection patterns may be used to have the n/2 higher order bits of pairs of n bit inputs multiplied together and to have the n/2 lower order bits of pairs of n bit inputs multiplied together. The butterfly cross connection patterns are implemented for select interconnections between multiplier circuits 136 and add-subtract-accumulate circuits 144. As mentioned above, add-subtract-accumulate circuits 144 may be configured to include four add (or subtract) units. Each add (or subtract) unit may have two n bit inputs from multiplier circuits 136. The butterfly cross connection patterns may be used to have the two inputs of each add (or subtract) unit be either the resultant of the multiplication of the higher order bits by the multipliers of multiplier circuits 136 or the resultant of the multiplication of the lower order bits by the multipliers of multiplier circuits 136. The butterfly cross connection patterns may also be used in the interconnect between add-subtract-accumulate circuits 144 and adder circuit 140. Adder circuit 140 may be split into two adders (e.g., two independent adders). The butterfly cross connection pattern may be used to feed the resultant of operations on higher order bits to a top half of adder circuit 140 and to feed the resultant of operations on lower order bits to a bottom half of adder circuit 140. In the n/2 bits by n/2 bits multiplier based organization, accumulator functionality may not be available. Accumulator functionality may not be available because the resources of MAC block 192 may be substantially consumed in allowing for the implementation of the n/2 bits by n/2 bits multiplier based organization.

The butterfly cross connection patterns are exemplary of techniques for decomposing a single multiplier circuit into multiple smaller multiplier circuits, exemplary of techniques for managing data so that the outputs of the multiple smaller multiplier circuits are appropriately added together (e.g., adding lower order bits to lower order bits), or exemplary of techniques for managing data to compensate for limitations in the resources of a MAC block. Such cross connect patterns may be used to handle connections because of the way that circuitry for a MAC block was laid down or because of the arrangement that was selected for the circuitry. The butterfly cross connection patterns are provided as an illustrative example. Other techniques may also be used. For example, the n bits by n bits multipliers may be decomposed in a different way that eliminates the need for the butterfly cross connection patterns or decomposed in a way that may require different types of cross connect patterns. Accordingly, other cross connection or connection patterns may be used to implement MAC block 192.

The flexibility and configurability of MAC block 192 may support the configuration of a set of modes of operation. If desired, MAC block 192 of FIG. 2 and MAC block 192 of FIG. 3 may each be a separate embodiment of a MAC block with each having its own set of modes of operation. In some embodiments, MAC block 192 may be configurable between having an n bits by n bits multiplier based organization or an n/2 bits by n/2 bits multiplier based organization and having modes of operation that are associated with each. The modes of MAC block 192 may be configured with memory bits to make the modes available to users.

FIGS. 4-11 are block diagram of illustrative implementations of different modes of operation that a MAC block according to the present invention may support. More particularly, the mode implementations of FIGS. 4-11 illustrate the components of the host MAC block that may be required to implement each respective mode. For example, if a particular mode implementation requires a single 18 bit by 18 bit multiplier, then the remaining multipliers may be used to implement other modes in accordance with the mode splitting features of the present invention.

Figure 4:
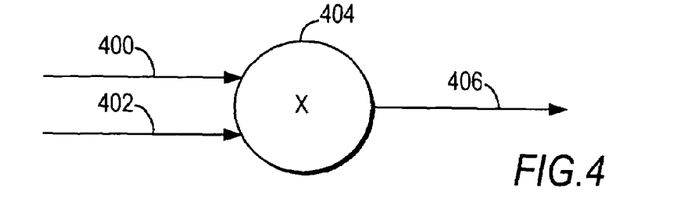
FIG. 4 is a schematic diagram of an illustrative 18 bit by 18 bit multiply mode implementation in accordance with the present invention.

FIG. 4 is a block diagram of an illustrative implementation of an 18 bit by 18 bit multiply mode in a MAC block. As illustrated, a single 18 bit by 18 bit multiply implementation makes use of one 18 bit by 18 bit multiplier 404 having multiplicand and multiplier inputs 400 and 402 and a product output 406. In a typical MAC block, the illustrated implementation would permit four such multiply modes to be implemented in a single MAC block simultaneously, each using one of the four available multipliers. In accordance with the mode splitting features of the present invention, the remaining three multipliers may be used to implement any other suitable mode simultaneously with the 18 bit by 18 bit multiply mode that multiplier 404 is being used to implement.

Figure 5:
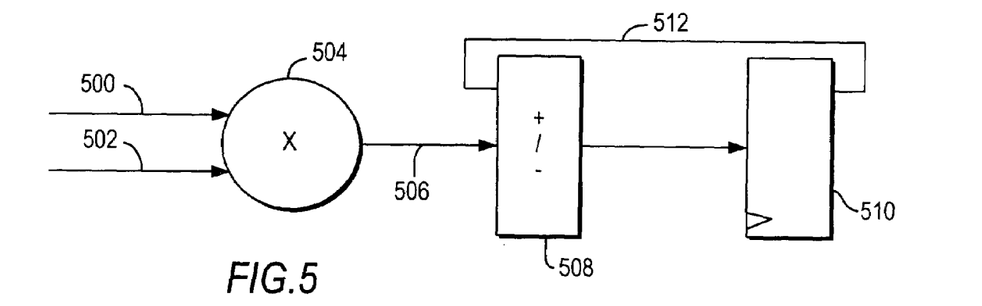
FIG. 5 is a schematic diagram of an illustrative 52 bit accumulate mode implementation in accordance with the present invention.

FIG. 5 is a block diagram of an illustrative implementation of a 52 bit accumulate mode in a MAC block. As illustrated, a single 52 bit accumulate mode implementation makes use of one 18 bit by 18 bit multiplier 504 having inputs 500 and 502 and an output 506. Adder/subtracter 508 is used to perform addition operations to update the running sum stored in register 510. Output 512 of register 510 is fed back into adder/subtracter 508 to be added with a next output 506 of multiplier 504. In a typical MAC block, the illustrated implementation would permit two such accumulate modes to be implemented in a single MAC block simultaneously, each using one of the four available multipliers (i.e., wasting two of the multipliers) when using a MAC block such as MAC block 192 of FIG. 2. This is because of the limited dedicated arithmetic circuitry available in MAC block 192 of FIG. 2. In accordance with the mode splitting features of the present invention, however, the remaining multipliers may be used in implementing other modes simultaneously with the accumulating mode that do not rely on the dedicated circuitry already being used (e.g., an 18 bit by 18 bit multiply mode). This allows more efficient use of MAC block resources.

Figure 6:
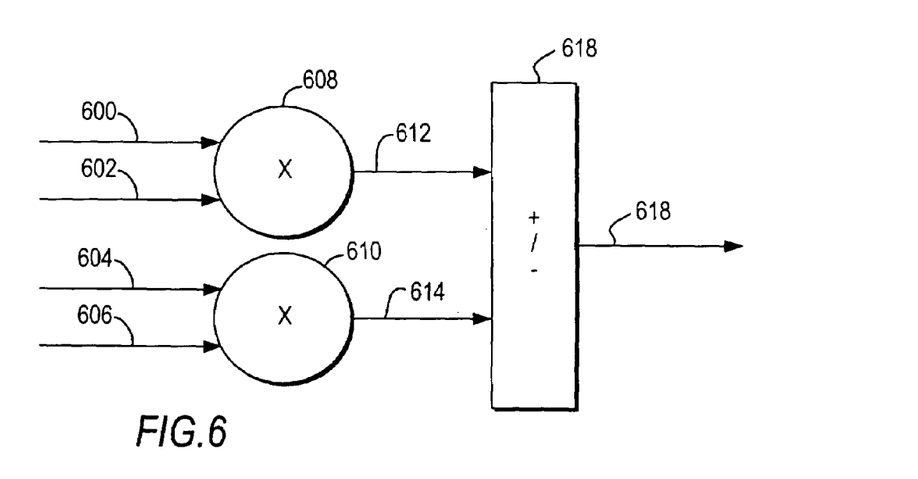
FIG. 6 is a schematic diagram of an illustrative sum of two 18 bit by 18 bit multiplications mode implementation in accordance with the present invention.

FIG. 6 is a block diagram of an illustrative implementation of the sum of the products of two 18 bit by 18 bit multipliers mode in a MAC block (e.g., the two multipliers of either the top half or of the bottom half). As illustrated, a single sum of the products of two multipliers mode implementation makes use of two multipliers 608 and 610 having inputs 600, 602, 604, and 606. Products 612 and 614 are input into adder/subtracter 616, which provides output 618. In a typical MAC block, the illustrated implementation would permit two such sum of the products of two multipliers modes to be implemented in a single MAC block simultaneously, each using two of the four available multipliers. In accordance with the mode splitting features of the present invention, the remaining two multipliers may be used to implement any other suitable mode simultaneously with the sum of the products of two multipliers mode that multipliers 608 and 610 are being used to implement.

Figure 7:
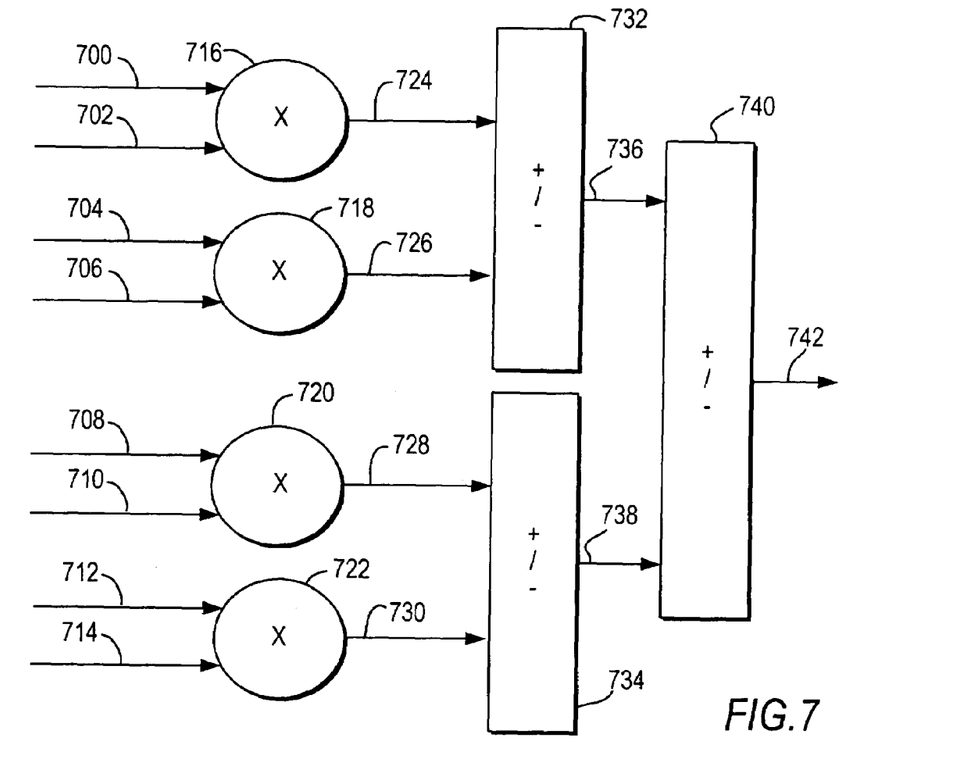
FIG. 7 is a schematic diagram of an illustrative sum of four 18 bit by 18 bit multiplications mode implementation in accordance with the present invention.

FIG. 7 is a block diagram of an illustrative implementation of the sum of the products of four 18 bit by 18 bit multipliers mode in a MAC block. As illustrated, a single sum of the products of four multipliers mode implementation makes use of four multipliers 716, 718, 720, and 722 having inputs 700, 702, 704, 706, 708, 710, 712, and 714. Multipliers 716 and 718 may be top half multipliers and multipliers 720 and 722 may be bottom half multipliers. Products 724 and 726 are input into first stage adder/subtracter 732. Products 728 and 730 are input into first stage adder/subtracter 734. Outputs 736 and 738 from adders/subtracters 732 and 736 are input into second stage adder/subtracter 740, which produces output 742. Because all of the multipliers of the MAC block are being used in the implementation shown in FIG. 7, no other modes may be simultaneously implemented in accordance with the present invention.

Figure 8:
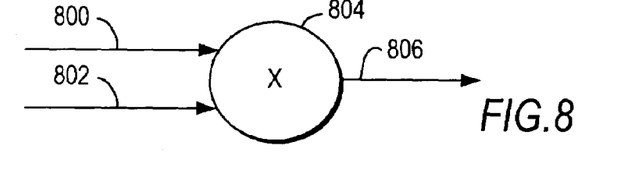
FIG. 8 is a schematic diagram of an illustrative 9 bit by 9 bit multiply mode implementation in accordance with the present invention.

FIG. 8 is a block diagram of an illustrative implementation of a 9 bit by 9 bit multiply mode in a MAC block. As illustrated, a single multiply mode makes use of a single 18 bit by 18 bit multiplier 804 having inputs 800 and 802 and an output product 806. In a typical MAC block (e.g., MAC block 192 in FIG. 3), the illustrated implementation would permit eight such 9 bit by 9 bit multiply modes to be implemented in a single MAC block simultaneously (i.e., each 18 bit by 18 bit multiplier may be used to implement two 9 bit by 9 bit multipliers). In accordance with the mode splitting features of the present invention, the remaining three 18 bit by 18 bit multipliers and one 9 bit by 9 bit multiplier may be used to implement any other suitable mode simultaneously with the 9 bit by 9 bit multiply mode that multiplier 804 is being used to implement. It will be understood that the other modes need not involve 9 bit by 9 bit multipliers (i.e., they may involve 18 bit by 18 bit multiplication).

Figure 9:
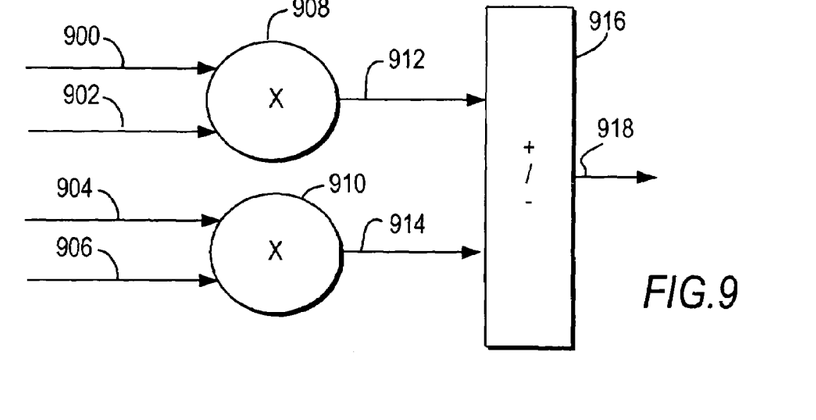
FIG. 9 is a schematic diagram of an illustrative sum of two 9 bit by 9 bit multiplications mode implementation in accordance with the present invention.

FIG. 9 is a block diagram of an illustrative implementation of the sum of the products of two 9 bit by 9 bit multipliers mode in a MAC block. As illustrated, a single sum of the products of two 9 bit by 9 bit multipliers mode implementation makes use of two multipliers 908 and 910 (e.g., either the two top half 18 bit by 18 bit multipliers or the two bottom half 18 bit by 18 bit multipliers) having inputs 900, 902, 904, and 906. Products 912 and 914 are input into adder/subtracter 916, which provides output 918. In a typical MAC block (e.g., MAC block 192 in FIG. 3), the illustrated implementation would permit four such sum of the products of two 9 bit by 9 bit multipliers modes to be implemented in a single MAC block simultaneously (i.e., because each 18 bit by 18 bit multiplier may implement two 9 bit by 9 bit multipliers). In accordance with the mode splitting features of the present invention, the remaining two 18 bit by 18 bit multipliers and two 9 bit by 9 bit multipliers may be used to implement any other suitable mode simultaneously with the sum of the products of two 9 bit by 9 bit multipliers mode that multipliers 908 and 910 are being used to implement.

Figure 10:
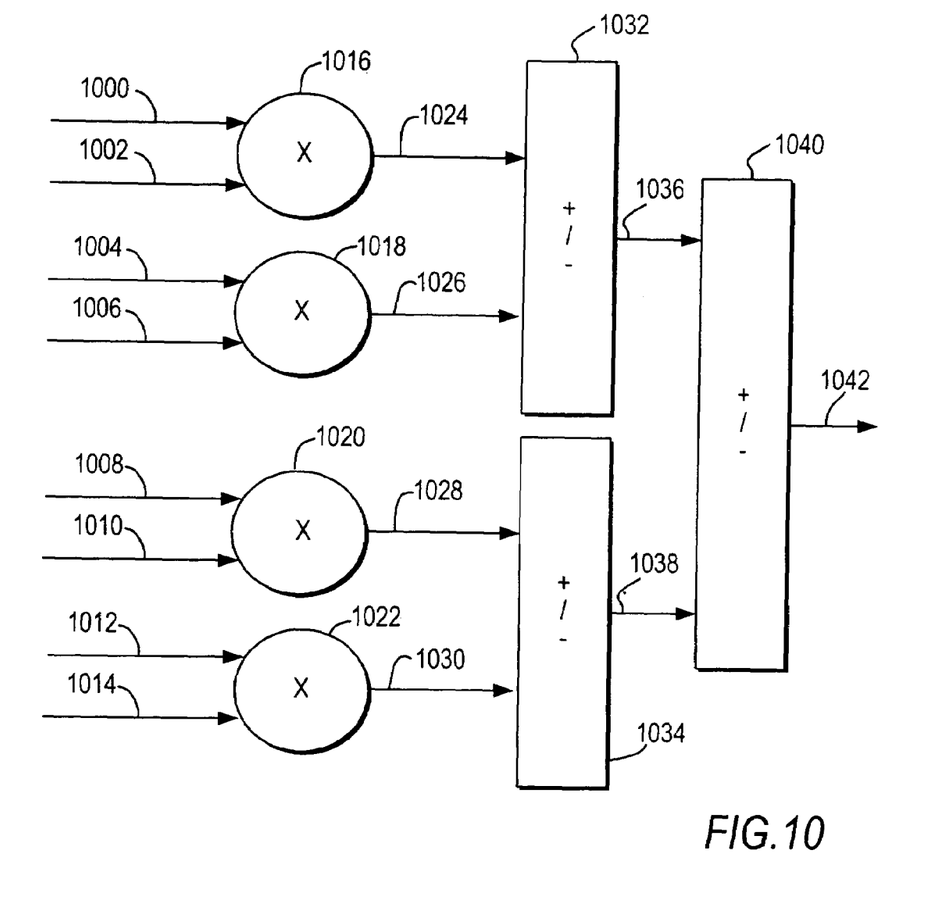
FIG. 10 is a schematic diagram of an illustrative sum of four 9 bit by 9 bit multiplications mode implementation in accordance with the present invention.

FIG. 10 is a block diagram of an illustrative implementation of the sum of the products of four 9 bit by 9 bit multipliers mode in a MAC block. As illustrated, a single sum of the products of four 9 bit by 9 bit multipliers mode implementation makes use of four 18 bit by 18 bit multipliers 1016, 1018, 1020, and 1022 having inputs 1000, 1002, 1004, 1006, 1008, 1010, 1012, and 1014. For example, multipliers 1016 and 1018 may be the top half multipliers and multipliers 1020 and 1022 may be the bottom half multipliers. Products 1024 and 1026 are input into first stage adder/subtracter 1032. Products 1028 and 1030 are input into first stage adder/subtracter 1034. Outputs 1036 and 1038 from adders/subtracters 1032 and 1036 are input into second stage adder/subtracter 1040, which produces output 1042. In a typical MAC block (e.g., MAC block 192 in FIG. 3), the illustrated implementation would permit two such sum of the products of four 9 bit by 9 bit multipliers modes to be implemented in a single MAC block simultaneously (i.e., because each 18 bit by 18 bit multiplier may implement two 9 bit by 9 bit multipliers). In accordance with the mode splitting features of the present invention, the remaining four 9 bit by 9 bit multipliers may be used to implement any other suitable mode simultaneously with the sum of the products of four 9 bit by 9 bit multipliers mode that multipliers 1016, 1018, 1020, and 1022 are being used to implement. It will be understood that if there is a lack of resources (e.g., adders), then certain modes will may not be implemented simultaneously with that of FIG. 10.

Figure 11:
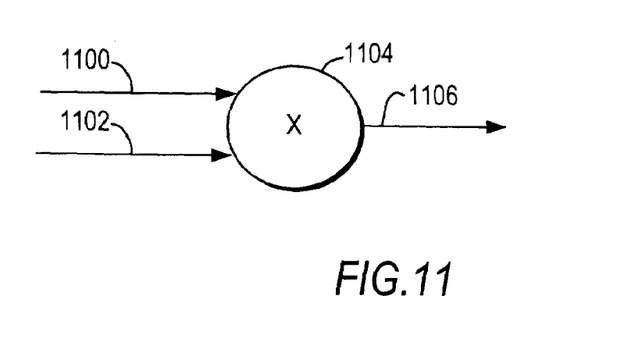
FIG. 11 is a schematic diagram of an illustrative 36 bit by 36 bit multiply mode implementation in accordance with the present invention.

FIG. 11 is a block diagram of an illustrative implementation of 36 bit by 36 bit multiply mode in a MAC block. Multiplier 1104, having inputs 1100 and 1102 and output product 906, is built from four 18 bit by 18 bit multipliers and adders. Because all of the multipliers of the MAC block are being used in the implementation shown in FIG. 11, no other modes may be simultaneously implemented in accordance with the present invention.

It will be understood that any other suitable modes may be implemented in a MAC block in accordance with the present invention. For example, certain modes may be implemented without the need for multipliers, such as 36 bit wide XOR gates, AND gates, OR gates, or any other suitable logical gates using, for example, the arithmetic circuitry of the MAC block. These modes may be useful in, for example, support of bitwise operations for microprocessors. It will also be understood that although some modes refer to a "sum", any other suitable arithmetic operation may be used (e.g., difference) using the adder/subtracter circuitry of the MAC blocks.

Other modes may include, for example, high bandwidth 16 bit and 32 bit cyclic redundancy code ("CRC") calculations. CRC is used in many communications protocols to ensure the received data is the same as the transmitted data. CRC encoding/decoding is relatively simple to implement for coding 1 bit at a time, but increases in complexity for coding multiple bits simultaneously.

Because 12 bit by 12 bit multiplication requires a full 18 bit by 18 bit multiplier to implement, waste of resources results (e.g., only 96 bits if the inputs/outputs are used). In accordance with the present invention, the four 18 bit by 18 bit multipliers of each MAC block may support six 12 bit by 12 bit multiplications, instead of only four, by allowing unused resources to be used in separate simultaneous modes. This is contrasted with implementing 9 bit by 9 bit multipliers from 18 bit by 18 bit multipliers because the splitting of an 18 bit by 18 bit multiplier into two 9 bit by 9 bit multipliers is contained within the 18 bit by 18 bit multiplier. Splitting two 18 bit by 18 bit multipliers into three 12 bit by 12 bit multipliers involves sharing resources between the multipliers. This requires complex routing and input mapping.

For similar reasons, a 24 bit by 24 bit multiplication, which would ordinarily require a full MAC block to implement in a 36 bit by 36 multiplication, may be made more efficient in accordance with the present invention to allow a single MAC block to support two simultaneous 24 bit by 24 bit multiplications.

The mode splitting features of the present invention may be implemented in any suitable way. For example, in one suitable approach, a MAC block may be configured using appropriate circuitry (e.g., including multiplexers, registers, etc.) to allow different modes to be implemented simultaneously within the same MAC block. Any suitable control signals may be used in order to indicate how a MAC block is to be configured with regard to the modes to be simultaneously implemented. Any or all of these control signals may be user-controlled.

Figure 12:
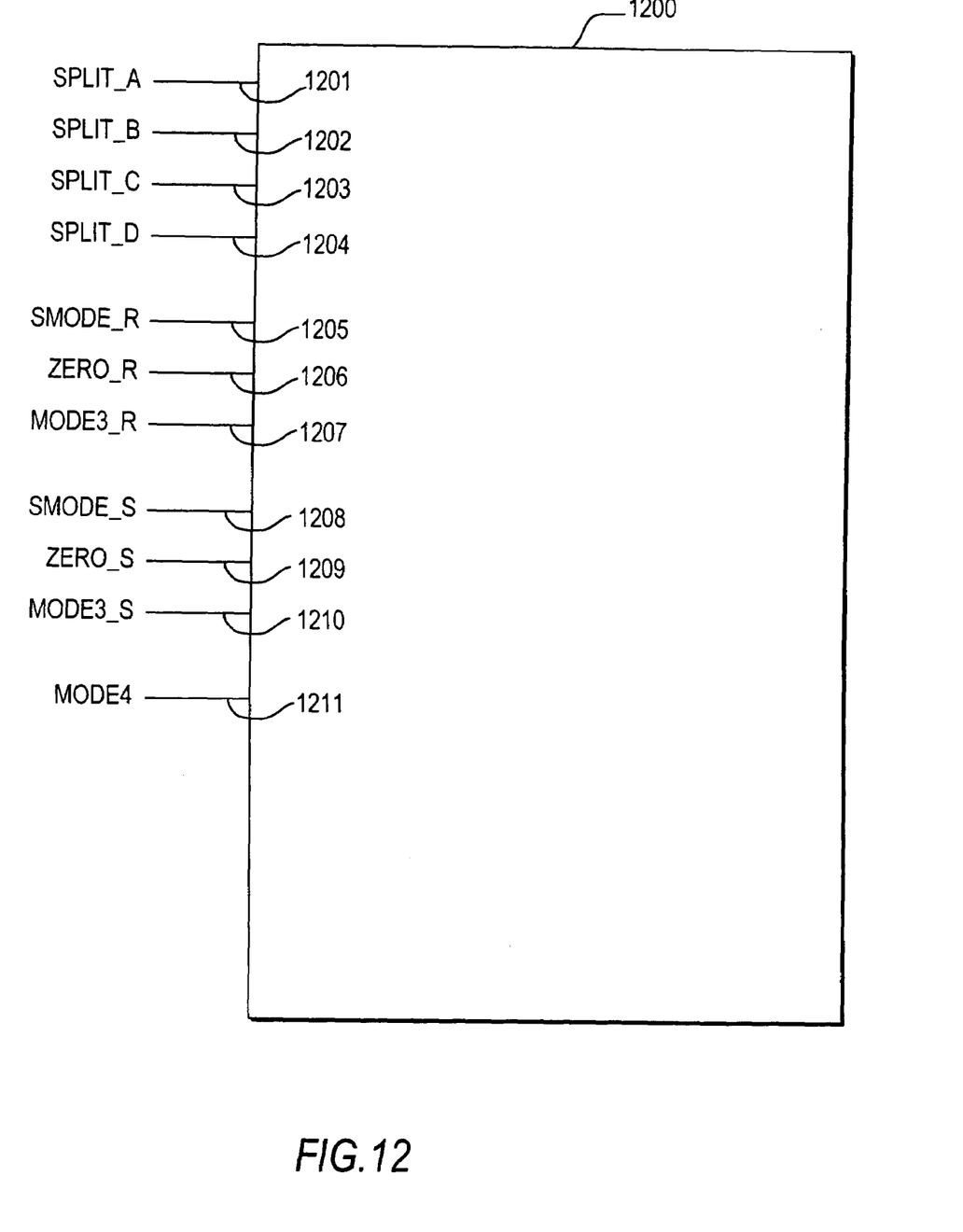
FIG. 12 is a block diagram of a MAC block having illustrative control signals in accordance with the present invention.

FIG. 12 is a simplified block diagram of a MAC block 1200 according to the present invention having control signals 1201-1211. Control signals 1201-1211 may indicate in which mode or modes MAC block 1200 simultaneously operates. Control signals 1201-1211 are merely illustrative. It will be understood that any other suitable control signals may be used to implement the mode splitting features of the present invention. For purposes of brevity and clarity, not by way of limitation, and without loss of generality, the present invention is primarily described herein in terms of control signals 1201-1211.

Control signals 1201-1204 are "SPLIT" signals that indicate for each of the four respective 18 bit by 18 bit multipliers of MAC block 1200 whether the multiplier is to be used as an 18 bit by 18 bit multiplier or whether the multiplier is to be used as two 9 bit by 9 bit multipliers. Any suitable number of SPLIT signals may be used to implement any suitable mode requiring the use of a particular sized multiplier. For example, if a particular mode requires the use of 4 bit by 4 bit multipliers, then additional SPLIT signals may be used. In another suitable approach, SPLIT signals may be used to indicate that a particular multiplier is be used as two or more smaller multipliers (i.e., as opposed to be split into only two smaller multipliers).

Control signals 1205 and 1208 represent "SMODE" signals that may be used to indicate whether the accumulator functionality of MAC block 1200 is to be enabled. Thus, control signals 1205 and 1208 may be used to implement a 52 bit accumulate mode. Control signal 1205 may be associated with the top half of MAC block 1200 whereas control signal 1208 may be associated with the bottom half of MAC block 1200.

Control signals 1206 and 1209 represent "ZERO" signals that may be used to indicate, together with the SMODE signal, whether mode 2A is to be implemented. Mode 2A is used to initialize (e.g., by zeroing) the accumulator components used in mode 2 (i.e., 52-bit accumulator mode described with reference to FIG. 5 above). With reference to FIG. 2, control signals 1206 and 1209 may, for example, cause appropriate bits of either top half adder/subtracter 144 or bottom half adder/subtracter 144, respectively, to be tied to ground in order to zero the accumulator. Control signals 1206 and 1209 may also be used to indicate, in one particular arrangement, a 36 bit by 36 bit multiply. That is, in a preferable implementation of a 36 bit by 36 bit multiply mode, zeroing of the adder/subtracters may be necessary.

Control signals 1207 and 1210 represent "MODE3" signals that may be used to indicate when the outputs of two multipliers (i.e., either two in the top half or two in the bottom half of the MAC block) are to be added together. Control signals 1207 and 1210 are therefore used to indicate when the sum of two 18 bit by 18 bit multiplications mode is to be implemented or when the sum of two 9 bit by 9 bit multiplications mode is to be implemented. Control signals 1207 and 1210 are associated with the top half and the bottom half of the MAC block, respectively.

Control signal 1211 represents a "MODE4" signal that may be used to indicate when the outputs of four multipliers are to be added together. Control signal 1211 is therefore used to indicate when the sum of four 18 bit by 18 bit multiplications mode is to be implemented or when the sum of four 9 bit by 9 bit multiplications mode is to be implemented. Because all four multipliers of the MAC block are used in these modes, a single MODE4 signal is used for the entire MAC block.

Table 1, below, summarizes the above control signals as used to implemented each of the respective modes described. A, B, C, and D represent each of the four 18 bit by 18 bit multipliers in the MAC block, with A and B being the top half multipliers and C and D being the bottom half multipliers. R and S represent the top half and bottom half of the MAC block.

TABLE 1

| MODE | DESCRIPTION | SPLIT <A\|B\| C\|D> | SMODE <R\|S> | ZERO <R\|S> | MODE3 <R\|S> | MODE4 |
|---|---|---|---|---|---|---|
| 1 | 18b × 18b multiply | 0 | 0 | 0 | 0 | 0 |
| 2 | 52 bit accumulate | 0 | 1 | 0 | 0 | 0 |
| 2A | Initialize/Zero Accumulator | 0 | 1 | 1 | 0 | 0 |
| 3 | Sum of 2 18b × 18b multiply | 0 | 0 | 0 | 1 | 0 |
| 4 | Sum of 4 18b × 18b multiply | 0 | 0 | 0 | 0 | 1 |
| 5 | 9b × 9b multiply | 1 | 0 | 0 | 0 | 0 |
| 6 | Sum of 2 9b × 9b multiply | 1 | 0 | 0 | 1 | 0 |
| 7 | Sum of 4 9b × 9b multiply | 1 | 0 | 0 | 0 | 1 |
| 8 | 36b × 36b multiply | 0 | 0 | 1 | 0 | 0 |

Each of modes 1-8 in TABLE 1 may be implemented in either a single 18 bit multiplier, in half of the MAC block (i.e., either the top half or the bottom half), or in the entire MAC block. TABLE 2 summarizes this flexibility below.

TABLE 2

| MODE | Description | Per Multiplier | Per half MAC block | Per MAC block |
|---|---|---|---|---|
| 1 | 18b × 18b multiply | X | | |
| 2 | 52 bit accumulate | | X | |
| 2A | Initialize/Zero Accumulator | | X | |
| 3 | Sum of 2 18b × 18b multiply | | X | |
| 4 | Sum of 4 18b × 18b multiply | | | X |
| 5 | 9b × 9b multiply | X | | |
| 6 | Sum of 2 9b × 9b multiply | | X | |
| 7 | Sum of 4 9b × 9b multiply | | | X |
| 8 | 36b × 36b multiply | | | X |

If a particular mode requires half of the MAC block, then the other half may be used by a half block mode or by a single multiplier mode (or two such modes). If a particular mode requires a single multiplier, then the remaining multipliers may be used by a half block mode, by single multiplier modes, or by both.

It will be understood that certain arrangements of a MAC block in accordance with the present invention may involve certain consequential and practical restrictions. For example, in one suitable arrangement, modes 4, 7, and 8 require control signals 1201-1204 to be set to the same value. Control signals 1205 and 1208 may be required to be set to the same value for modes 4, 7, and 8. Control signals 1206 and 1209 may be required to be set to the same value for modes 4, 7, and 8. Modes 3 and 6 may require control signals 1201 and 1202 to be set to the same value and control signals 1203 and 1204 to be set to the same value. It will be understood that such restrictions are merely illustrative and depend at least in part on the particular arrangement used, the application for which the MAC block will be used, or both.

It will be understood that any other suitable modes may be represented and implemented according to the present invention. It will further be understood that any other control signals may be used in addition to or in place of those illustrated.

Figure 13:
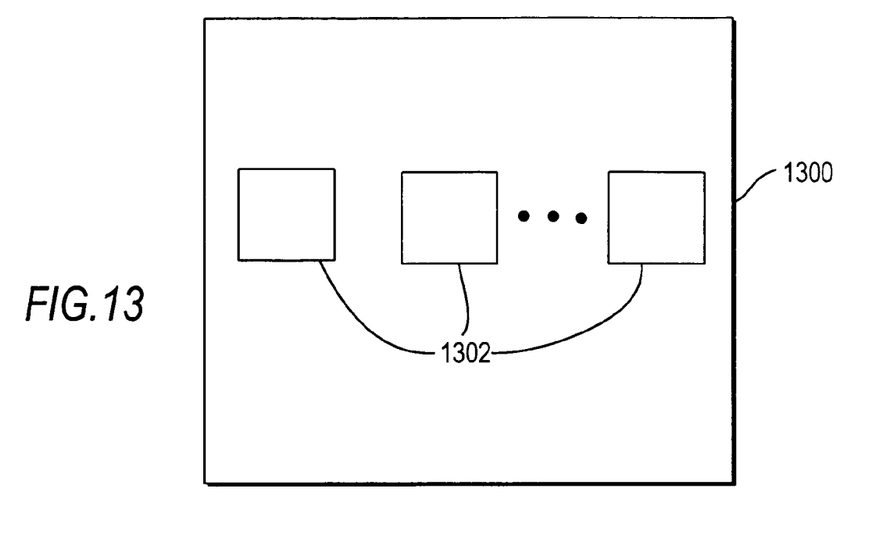
FIG. 13 is a block diagram of an illustrative programmable logic device having at least one MAC block in accordance with the present invention.

FIG. 13 is a simplified block diagram of a programmable logic device 1300 having one or more MAC blocks 1302 configured in accordance with the present invention. PLD 1300 may have any suitable interconnection circuitry, memory circuitry, and programmable logic circuitry to allow PLD 1300 to implement user designs and to make use of MAC blocks 1302 in implementing the user designs.

Figure 14:
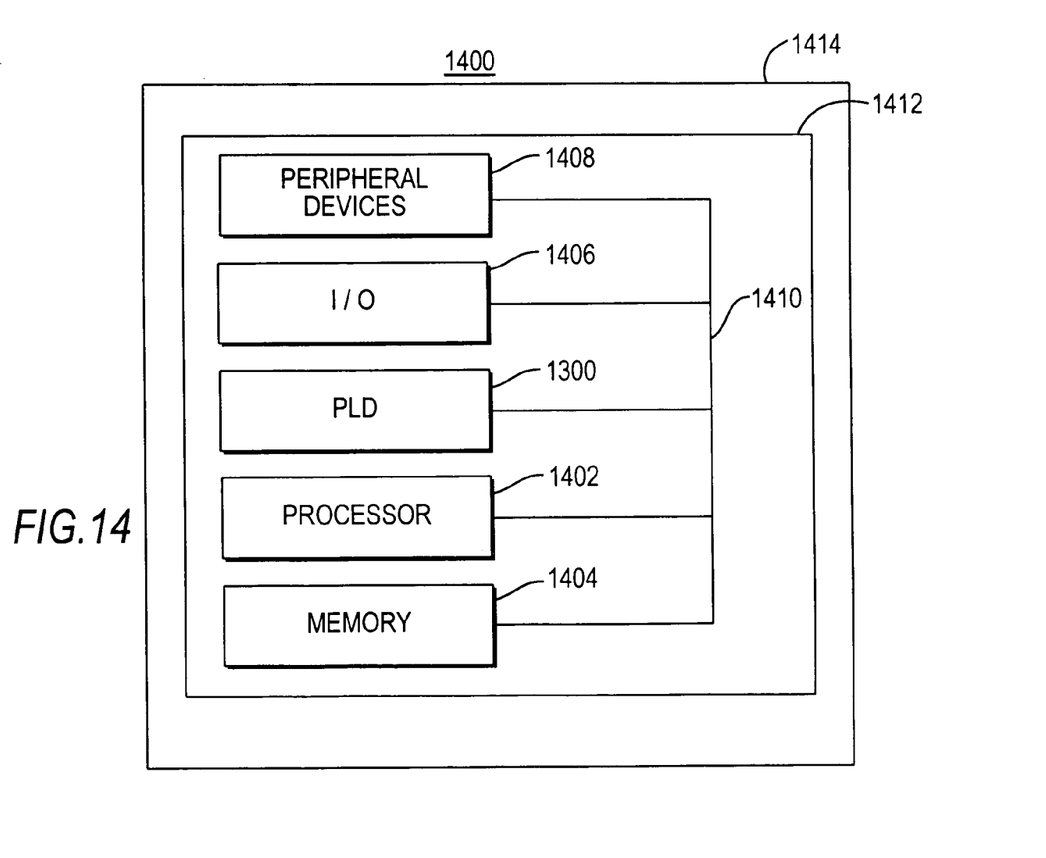
FIG. 14 is a block diagram of an illustrative system employing a programmable logic device in accordance with the present invention.

FIG. 14 illustrates a PLD 1300 (FIG. 13) of this invention (i.e., having at least one multiplier configured with the mode splitting features of the present invention) in a data processing system 1400 in accordance with one embodiment of the present invention. Data processing system 1400 may include one or more of the following components: a processor 1402; memory 1404; I/O circuitry 1406; and peripheral devices 1408. These components are coupled together by a system bus 1410 and are populated on a circuit board 1412 which is contained in an end-user system 1414.

System 1400 may be used in a wide variety of applications, such as computer networking, data networking, instrumentation, video processing, DSP, or any other application where the advantage of using programmable or reprogrammable logic is desirable. PLD 1300 may be used to perform a variety of different logic functions. For example, PLD 1300 may be configured as a processor or controller that works in cooperation with processor 1402. PLD 1300 may also be used as an arbiter for arbitrating access to a shared resource in system 1400. In yet another example, PLD 1300 may be configured as an interface between processor 1402 and one of the other components in system 1400.

Thus, a MAC block having mode splitting capabilities is provided. One skilled in the art will appreciate that the present invention can be practiced by other than the described embodiments, which are presented for purposes of illustration and not of limitation, and the present invention is limited only by the claims which follow.

What is claimed is:

1. A multiplier-accumulator block comprising:
    a first multiplier used in implementing a first mode of operation;
    a second multiplier used in simultaneously implementing a second mode of operation; and
    two additional multipliers, wherein the first multiplier is an 18 bit by 18 bit multiplier, the second multiplier is an 18 bit by 18 bit multiplier and the two additional multipliers are 18 bit by 18 bit multipliers.

2. The multiplier-accumulator block of claim 1 wherein at least one of the additional multipliers is used in implementing the first mode of operation.

3. The multiplier-accumulator block of claim 1 wherein at least one of the additional multipliers is used in implementing the second mode of operation.

4. The multiplier-accumulator block of claim 1 wherein the first mode is selected from the group consisting of: 18 bit by 18 bit multiply, 52 bits accumulate, initialize/zero accumulator, sum of 2 18 bit by 18 bit multiply, sum of 4 18 bit by 18 bit multiply, 9 bit by 9 bit multiply, sum of 2 9 bit by 9 bit multiply, sum of 4 9 bit by 9 bit multiply, and 36 bit by 36 bit multiply.

5. The multiplier-accumulator block of claim 1 further comprising a plurality of control signals used to indicate the first mode and the second mode.

6. The multiplier-accumulator block of claim 1 further comprising circuitry for adding, subtracting, and accumulating inputs.

7. The multiplier-accumulator block of claim 1 further comprising implementing a third mode of operation.

8. A programmable logic device comprising the multiplier-accumulator block of claim 1.

9. A printed circuit board on which is mounted a programmable logic device as defined in claim 8.

10. The printed circuit board defined in claim 9 further comprising:
    a memory mounted on the printed circuit board and coupled to the memory circuitry.

11. The printed circuit board defined in claim 10 further comprising:
    processing circuitry mounted on the printed circuit board and coupled to the memory circuitry.

12. A multiplier-accumulator block comprising:
    four 18 bit by 18 bit multipliers arranged in two pairs;
    a first arithmetic circuitry coupled to one of the pairs;
    a second arithmetic circuitry coupled to another of the pairs; and
    control circuitry coupled to the multipliers and the arithmetic circuitry, the control circuitry controls in which modes of operation the multiplier-accumulator is to operate, wherein the multiplier-accumulator is capable of operating in more than one mode of operation at one time.

13. The multiplier-accumulator block of claim 12 wherein the first arithmetic circuitry comprises adder, subtracter, and accumulator circuitry and the second arithmetic circuitry comprises adder, subtracter, and accumulator circuitry.

14. The multiplier-accumulator block of claim 12 further comprising second stage arithmetic circuitry coupled to the first arithmetic circuitry and the second arithmetic circuitry.

15. The multiplier-accumulator block of claim 12 wherein the control circuitry comprises control signals.

16. The multiplier-accumulator block of claim 15 wherein the control signals comprise control signals for indicating that a particular one of the multipliers is to be configured to be used as two or more smaller multipliers.

17. The multiplier-accumulator block of claim 15 wherein the control signals comprise control signals for indicating that the outputs of a particular pair of the two pairs of multipliers are to be summed together.

18. The multiplier-accumulator block of claim 15 wherein the control signals comprise control signals for indicating that the outputs of the four multipliers are to be summed together.

19. The multiplier-accumulator block of claim 12 wherein the modes of operation are selected from the group consisting of: 18 bit by 18 bit multiply, 52 bits accumulate, initialize/zero accumulator, sum of 2 18 bit by 18 bit multiply, sum of 4 18 bit by 18 bit multiply, 9 bit by 9 bit multiply, sum of 2 9 bit by 9 bit multiply, sum of 4 9 bit by 9 bit multiply, and 36 bit by 36 bit multiply.

* * * * *